US008644898B1

(12) United States Patent
De Andrade et al.

(10) Patent No.: US 8,644,898 B1
(45) Date of Patent: Feb. 4, 2014

(54) SUPERCONDUCTOR DEVICE HAVING A PATTERN OF ENGINEERED DEFECTS FOR CONTROLLING MAGNETIC FLUX

(75) Inventors: Marcio C. De Andrade, San Diego, CA (US); Anna M. Leese De Escobar, San Diego, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 158 days.

(21) Appl. No.: 13/461,530

(22) Filed: May 1, 2012

(51) Int. Cl.
    *H01L 39/24* (2006.01)

(52) U.S. Cl.
    USPC .......................................... 505/220; 505/300

(58) Field of Classification Search
    USPC .......... 505/150, 191, 204, 220, 300, 320, 330
    See application file for complete search history.

(56) References Cited

U.S. PATENT DOCUMENTS

| | | | |
|---|---|---|---|
| 3,999,204 A | | 12/1976 | Fulton |
| 5,126,315 A | * | 6/1992 | Nishino et al. ................ 505/181 |
| 5,326,745 A | * | 7/1994 | Nishino et al. ................ 505/220 |
| 5,729,046 A | * | 3/1998 | Nishino et al. ................ 257/661 |
| 6,069,369 A | * | 5/2000 | Nishino et al. ................ 257/34 |
| 6,469,880 B1 | | 10/2002 | Barabasi et al. |
| 6,787,798 B1 | | 9/2004 | Andrews et al. |

OTHER PUBLICATIONS

Lee, C.S., Janko, B., Derenly, I., Barabasi, A.L., "Reducing vortex density in superconductors using the ratchet effect", Nature, vol. 400, pp. 337-340, Jul. 22, 1999.
Olson, C.J., Reichhardt, C., Janko, B., Nori, F., "Collective Interaction-Driven Ratchet for Transporting Flux Quanta", Physical Review Letters, vol. 87, No. 17, pp. 177002-1-177002-4, Oct. 22, 2001.
Savel' ev, S., Nori, F., "Experimentally realizable devices for controlling the motion of magnetic flux quanta in anisotropic superconductors," Nature, vol. 1, pp. 179-184, Nov. 2002.
Savel'ev, S., Marchesoni, F., Nori, F., "Controlling Transport in Mixtures of Interacting Particles using Brownian Motors," Physical Review Letters, vol. 91, No. 1, pp. 010601-1-010601-4, Jul. 4, 2003.
Van De Vondel, J., De Souza Silva, C.C., Zhu, B.Y., Morelle, M., Moshchalkov, V.V., Vortex rectification effects in films with periodic asymmetric pinning, Physical Review Letters, vol. 94, No. 5, 2005.
Togawa, Y., Harada, K., Akashi, T., Kasai, H., Matsuda, T., Nori, F., Maeda, A., Tonomura, A., Direct Observation of Rectified Motion of Vortices in a Niobium Superconductor, Physical Review Letters, PRL 95, 087002 (2005), pp. 087002-1-087002-4, Aug. 19, 2005.

* cited by examiner

*Primary Examiner* — Colleen Dunn
(74) *Attorney, Agent, or Firm* — Ryan J. Friedl; Kyle Eppele

(57) ABSTRACT

A device includes a circuitry layer having one or more circuitry regions and a superconducting layer having a plurality of naturally-occurring defects. Potential wells are formed in the superconducting layer and located outside of the bounds of the circuitry regions. A pattern of engineered defects is formed in the superconducting layer and are configured such that, upon encountering a pulse of electromagnetic energy applied at a high potential region of the superconducting layer prior to energizing any circuits within the circuitry layer and when the superconducting layer is in a superconducting state, magnetic flux trapped within the naturally-occurring defects is directed to one or more of the potential wells.

20 Claims, 8 Drawing Sheets

SUPERCONDUCTOR DEVICE HAVING A PATTERN OF ENGINEERED DEFECTS FOR CONTROLLING MAGNETIC FLUX

FEDERALLY-SPONSORED RESEARCH AND DEVELOPMENT

The Superconductor Device Having a Pattern of Engineered Defects for Controlling Magnetic Flux is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac T2@navy.mil; reference Navy Case Number 100953.

BACKGROUND

Trapped magnetic flux reduces the operational capability of circuitry contained within a superconducting device. Several methods have been devised to overcome the trapped flux problem, including the pinning of vortices by the incorporation of impurities and defects, the construction of flux dams, slots, and holes, and the use of magnetic shields. While beneficial, such methods have not been successful in controlling and removing the trapped flux. A new system and method for controlling magnetic flux within a superconducting device is needed.

DETAILED DESCRIPTION OF SOME EMBODIMENTS

Figure 1:
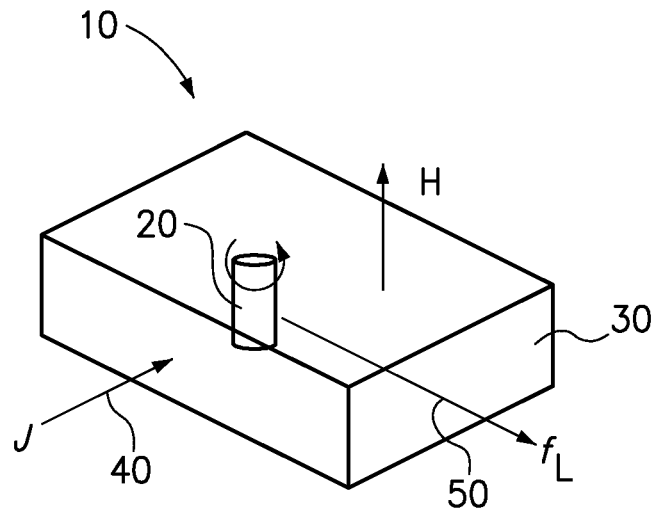
FIG. 1 shows a diagram illustrating the typical forces governing the motion of a vortex inside a superconductor substrate placed in an external magnetic field.

FIG. 1 shows a diagram 10 illustrating the typical forces governing the motion of a vortex 20 inside a superconductor substrate 30 placed in an external magnetic field H. As shown, a direct current density J flowing along the y-axis as shown by arrow 40, induces a Lorentz force $f_L$ that causes the vortex to move in a direction along the x-axis as shown by arrow 50. The magnetic field H causes superconductor substrate 30 to be patterned with a pinning potential $U(x,y)=U(x)$, which is periodic and asymmetric along the x-axis and is translationally invariant along the y-axis. An example asymmetric periodic potential is the asymmetric sawtooth potential. A ratchet velocity can be induced by the combination of an asymmetric potential and an alternating current driving force. Such a ratchet velocity may be used to drive vortices out of a superconductor, as discussed by Lee et al., "Reducing Vortex Density in Superconductors Using the Ratchet Effect", Letters to Nature, Vol. 400, 22 Jul. 1999.

Figure 2:
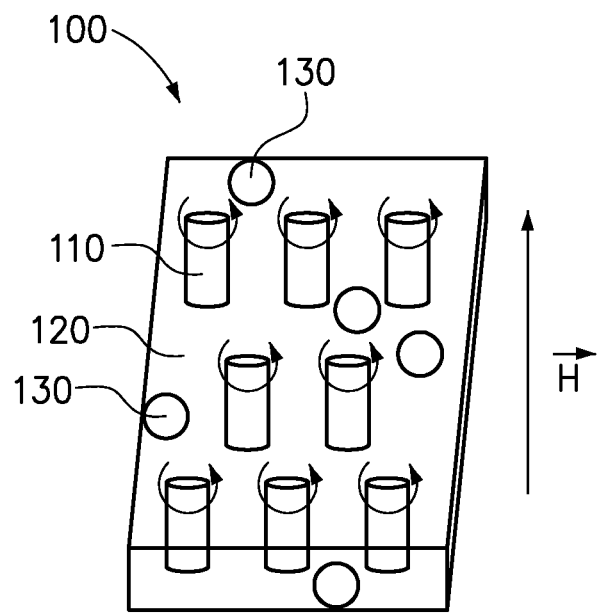
FIG. 2 shows a diagram illustrating a plurality of vortices' motions in a superconductor substrate having a plurality of disordered defects therein.
Figure 3:
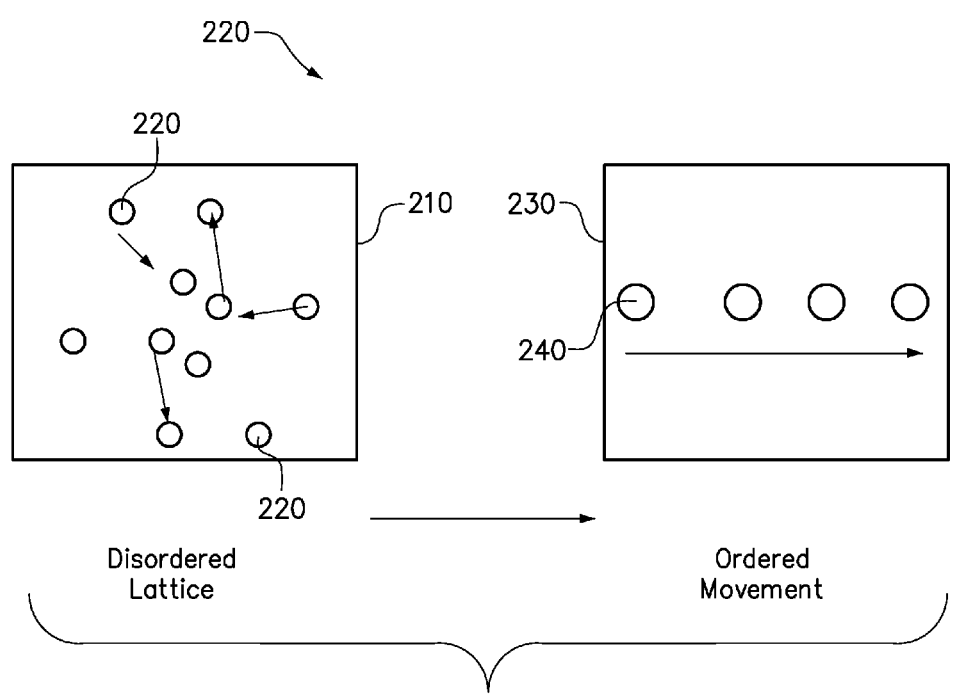
FIG. 3 shows a diagram illustrating how a disordered lattice of defects introduced into a superconductor substrate will induce an ordered movement of vortices within the substrate.

Referring to FIGS. 2 and 3, FIG. 2 shows a diagram 100 illustrating a plurality of vortices' 110 motions in a superconductor substrate 120 having a plurality of defects 130 therein and subjected to an external magnetic field H. As shown, defects 130 are not in an ordered pattern within superconductor substrate 120. FIG. 3 shows a diagram 200 illustrating how a disordered lattice of defects introduced into a substrate will induce an ordered movement of vortices within the substrate. Reference 210 represents a lattice including a plurality of defects 220 in a disordered pattern. Reference 230 represents how the disordered defects 220 in the lattice cause vortices 240 to arrange and move in an ordered pattern.

Figure 4:
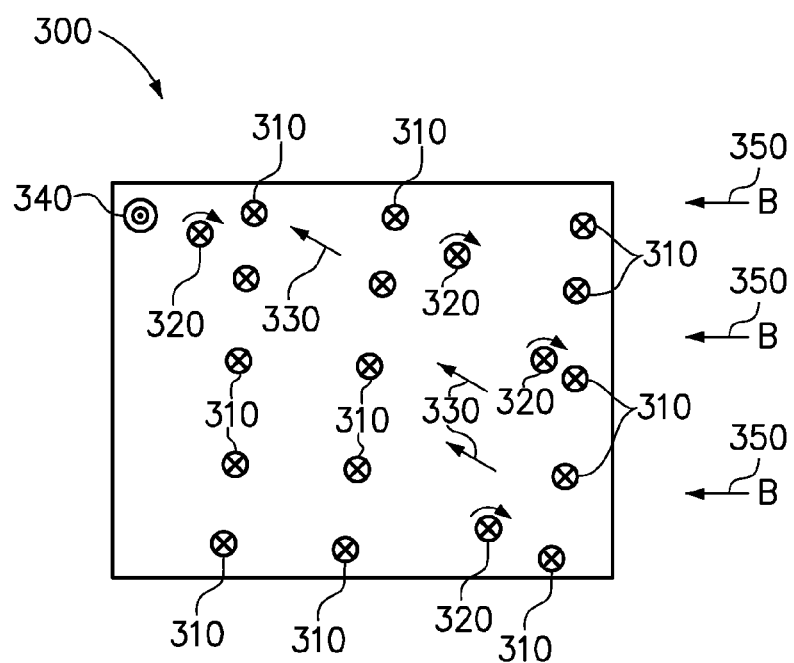
FIG. 4 shows a top view of a substrate having an engineered pattern of defects therein, illustrating the movement of trapped flux in response to an applied pulse of electric current.

FIG. 4 shows a top view of a superconductor substrate 300 having an engineered pattern of defects therein. As used herein, the term "engineered pattern of defects" refers to a pattern of defects that does not naturally occur within the superconductor substrate. Rather, the engineered pattern of defects is artificially created within the superconductor substrate. As shown, engineered defects 310 are in a pattern within superconductor substrate 300. When a pulse of electromagnetic energy, represented by arrows 350, is applied to substrate 300, trapped flux 320 will move, in the direction indicated by arrows 330, to a potential well 340 located within superconducting substrate 300. The movement of flux, in a specific direction, 320 is due to the "ratchet effect" mentioned above in the referenced article by Lee et al. However, unlike in Lee, where the magnetic flux inside the sample is only partially removed to the edge of the samples, the magnetic flux will be moved to a variety of traps located at pre-determined regions. This introduces a unique solution of completely removing vortices of the areas on interest, i.e, where there is sensitive circuitry that can be affected by magnetic flux.

Figure 5:
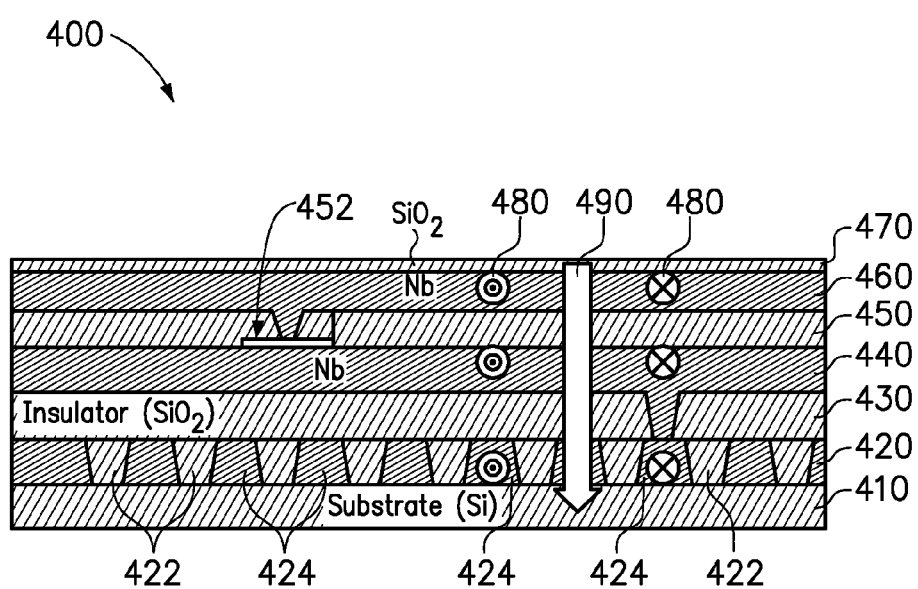
FIG. 5 shows a typical side cross-section view of a superconducting device having a pattern of engineered defects in a superconductor layer, illustrating the movement of trapped flux in response to an applied pulse of electric current.

FIG. 5 shows a side cross-section view of a superconducting device 400. Device 400 includes a substrate layer 410, first superconductor layer 420, first insulator layer 430, second superconductor layer 440, circuitry layer 450, third superconductor layer 460, and second insulator layer 470. It should be recognized that more or less superconductor layers and insulating layers may be incorporated into device 400. As an example, each of superconductor layers 420, 440, and 460 may comprise niobium or another type II superconducting material. In other embodiments, superconductor layers 420, 440, 460 may be comprised of any type II superconducting material including, for example, ceramic superconductors. As shown, superconducting layer 420 is parallel to and located below circuitry layer 450. Superconducting layers 420, 440, and 460 each have a plurality of naturally-occurring defects therein and a pattern of engineered defects formed therein. Non-limiting examples of naturally-occurring defects include oxygen and other gases impurities.

Figure 6:
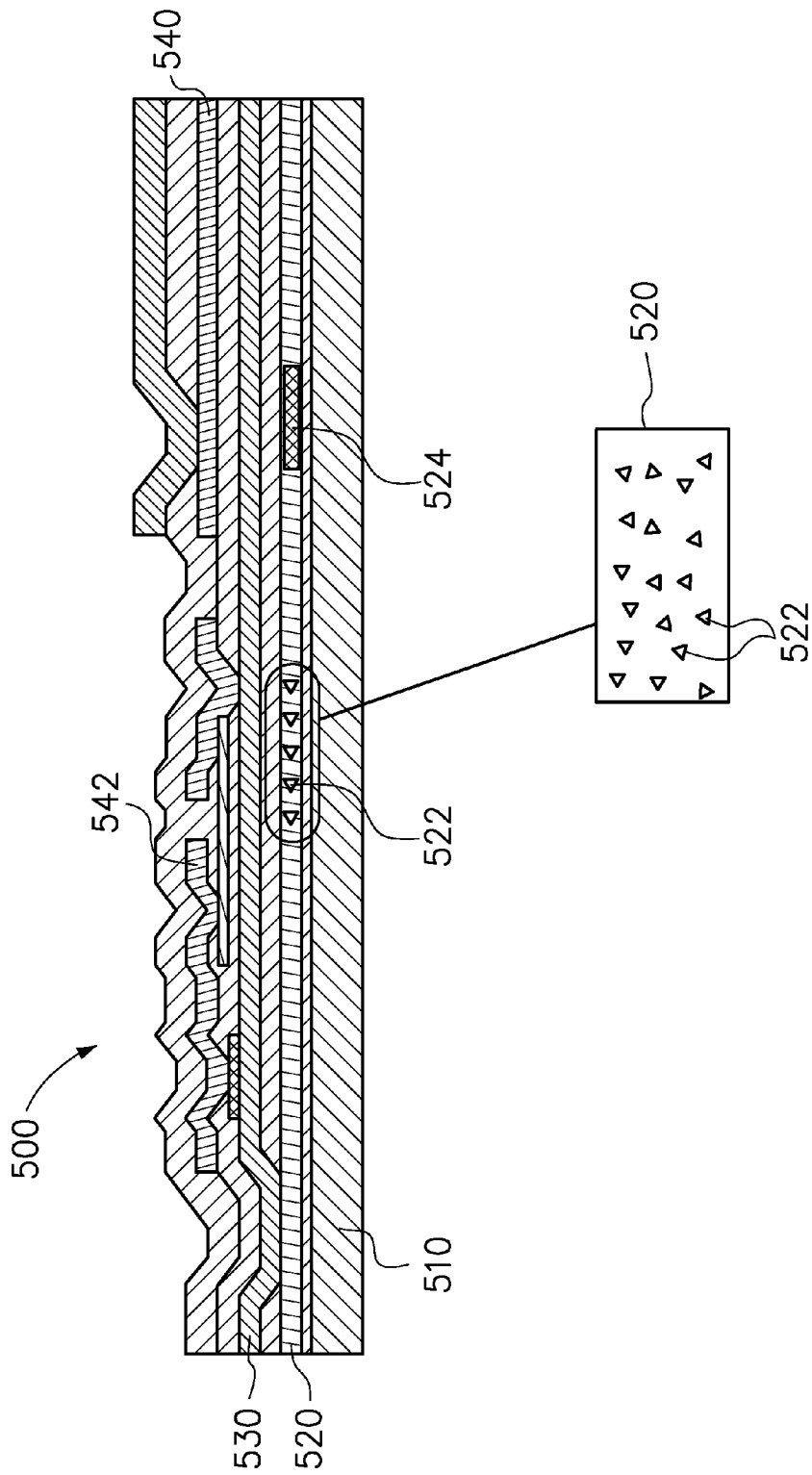
FIG. 6 shows a side cross-section view of a superconducting device having an asymmetric pattern of engineered defects in a superconducting layer.

In some embodiments, the pattern of engineered defects comprises an asymmetric pattern. An example of an asymmetric pattern is shown in FIG. 6. In some embodiments, the pattern of engineered defects is configured based upon the thickness of the superconducting layer, the type of superconducting material of the superconducting layer, and the type and size of the engineered defects. For example, based upon the thickness of the superconducting layer, the type of superconducting material, and the type and size of the engineered defects, the engineered pattern of defects may be configured such that the potential of these engineered defects exceeds the strength of the naturally occurring pinning locations, causing the vortices initially pinned on these naturally occurring locations to be dragged by the engineered (artificially constructed) pattern of defects without being able to move back to their original location due to the energy restrictions imposed by the engineered pattern of defects.

First superconductor layer 420 includes a plurality of insulator regions 422 and a plurality of potential wells 424 formed therein. Potential wells 424 may be formed by introducing impurities by variation in oxygen content, changing local niobium stoichiometry, lithographic process, or any other process that can be characterized as flux pinning centers. In some embodiments, and as shown in FIG. 5, potential wells 424 are formed between insulator regions 422. The number of potential wells formed within the superconducting layer may be based upon the size of the pattern of engineered defects.

Figure 7:
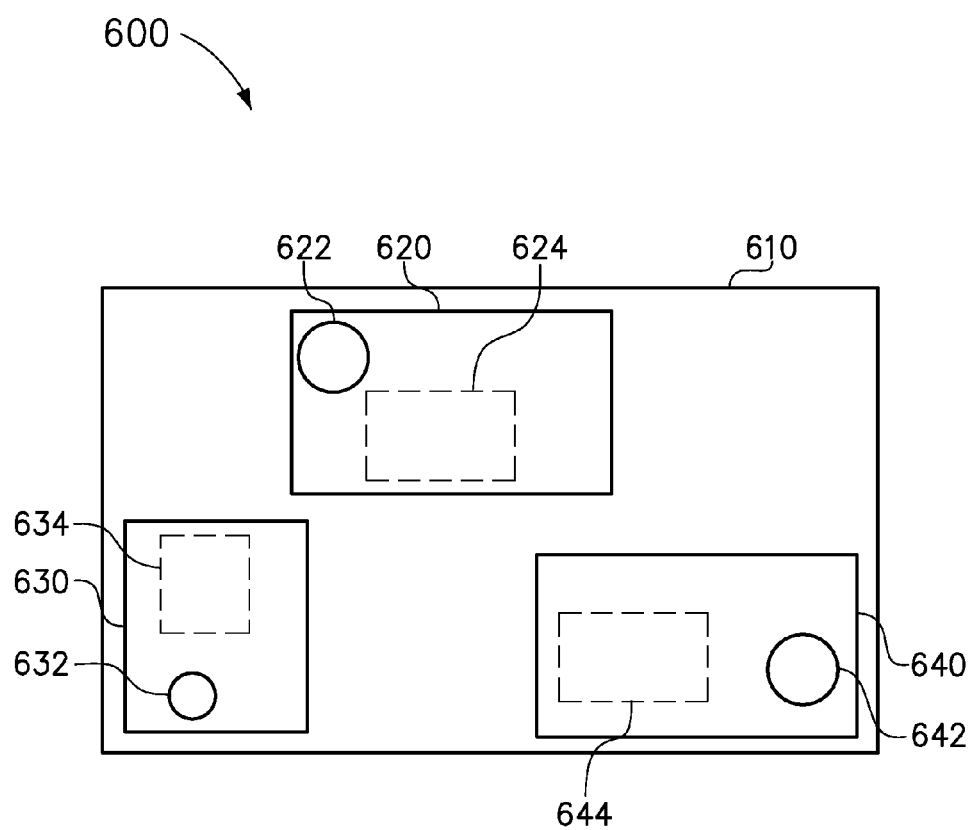
FIG. 7 shows a top view of a superconducting layer of a superconducting device having multiple engineered defect regions with a potential well located in each region.

Circuitry layer 450 includes one or more circuitry regions 452 located therein. As shown, potential wells 424 are formed throughout first superconductor layer 420, including below circuitry region 452. However, in other embodiments, potential wells are located outside of the bounds of the circuitry regions, as is shown in FIG. 7. Locating potential wells 424 outside of the bounds of the circuitry region allows for a configuration that does not take up valuable space where circuitry can be patterned. Furthermore, such a configuration gives more flexibility on sizes, location, and geometry of potential wells 424.

FIG. 5 illustrates the movement of trapped flux in response to an applied pulse of electromagnetic energy, represented by the large arrow 490. As shown, when the pulse is applied, flux 480 moves down from each of superconductor layers 440 and 460 towards potential wells 424. The pattern of engineered defects in each of superconducting layers 420, 440, and 460 is configured such that, upon encountering the pulse of electromagnetic energy, magnetic flux 480 trapped within the naturally-occurring defects is directed to one or more of potential wells 424. Magnetic flux gets trapped in the naturally-occurring defects because these are non-superconducting regions.

The magnetic flux vortice can be controlled in an asymmetric potential. A high potential region of the superconductor device is, for example, a region where the pinning energy is large than subsequent region where there is a lower pinning energy (potential). For example, the high potential region of device 400 may be the left side of the device and the low potential region of device 400 may subsequently be the right side. Therefore, the flux is always moving in a predetermined direction defined by the engineered pattern geometry. Furthermore, the potential of the artificial pinning sites exceeds the strength of the naturally occurring pinning locations allowing the vortices initially pinned on these naturally occurring locations to be dragged by the artificially constructed array of defects.

FIG. 6 shows a side cross-section view of a superconducting device 500. Device 500 includes a substrate layer 510 a first superconducting layer 520, a second superconducting layer 530, and a circuitry layer 540 containing a circuitry region 542 therein. Each of the superconducting layers and circuitry layer 540 may be separated by oxide layers. As an example, the oxide layers may comprise $SiO_2$, while superconducting layers 520 and 530 comprise niobium. Second superconducting layer 530 is located between first superconducting layer 520 and circuitry layer 540. As shown, first superconducting layer 520 and second superconducting layer 530 are both parallel to circuitry layer 540. In other embodiments however, other configurations may be used depending upon the application.

Superconducting layer 520, which is the closest to substrate 510, contains an asymmetric pattern of engineered defects 522 therein, with such pattern shown in the close-up view. One example pattern of asymmetric defects is shown in FIG. 6. However, it should be recognized by one having ordinary skill in the art that other asymmetric patterns may be used in the ground superconducting layer 520. In some embodiments, pattern of engineered defects 522 is located throughout superconducting layer 520, while in other embodiments pattern of engineered defects 522 is located only in one or more portions of superconducting layer 520.

Pattern of engineered defects 522 is configured such that, upon encountering a pulse of electromagnetic energy that is applied at a high potential region of the second superconducting layer prior to energizing any circuits within the circuitry layer and when the second superconducting layer is in a superconducting state, magnetic flux trapped within the naturally-occurring defects and the second superconducting layer is directed to one or more of the potential wells. Pattern of engineered defects 522 may be configured based upon the size of the second superconducting layer, the type of superconducting material of the second superconducting layer, and the type and size of the engineered defects.

Superconducting layers 520 and 530 each include a plurality of naturally-occurring defects therein. Superconducting layer 520 includes at least one potential well 524 formed therein. As shown, potential well 524 is located outside of the bounds of circuitry region 542 located within circuitry layer 540. The number of potential wells 524 formed within first superconducting layer 520 may be based upon the size of the pattern of engineered defects.

FIG. 7 shows a top view diagram 600 of a superconducting layer 610 of a superconducting device having multiple engineered defect regions therein. Each engineered defect region includes a potential well located in each region. Each potential well is located outside of a circuitry region contained within a circuitry layer located within a parallel layer of the superconducting device. Each engineered defect region includes a pattern of engineered defects, such as pattern 522 shown in FIG. 6. As an example, superconducting layer 610 may be implemented in any of the devices shown in FIGS. 5, 6, and 8 and described herein.

As shown, superconducting layer 610 includes engineered defect region 620 with potential well 622 located therein outside the bounds of circuitry region 624 (shown by the dashed lines), engineered defect region 630 with potential well 632 located therein outside the bounds of circuitry region 634 (shown by the dashed lines), and engineered defect region 640 with potential well 642 located therein outside the bounds of circuitry region 644 (shown by the dashed lines). It should be recognized that more or less engineered defect regions may be located within superconducting layer 610.

Figure 8:
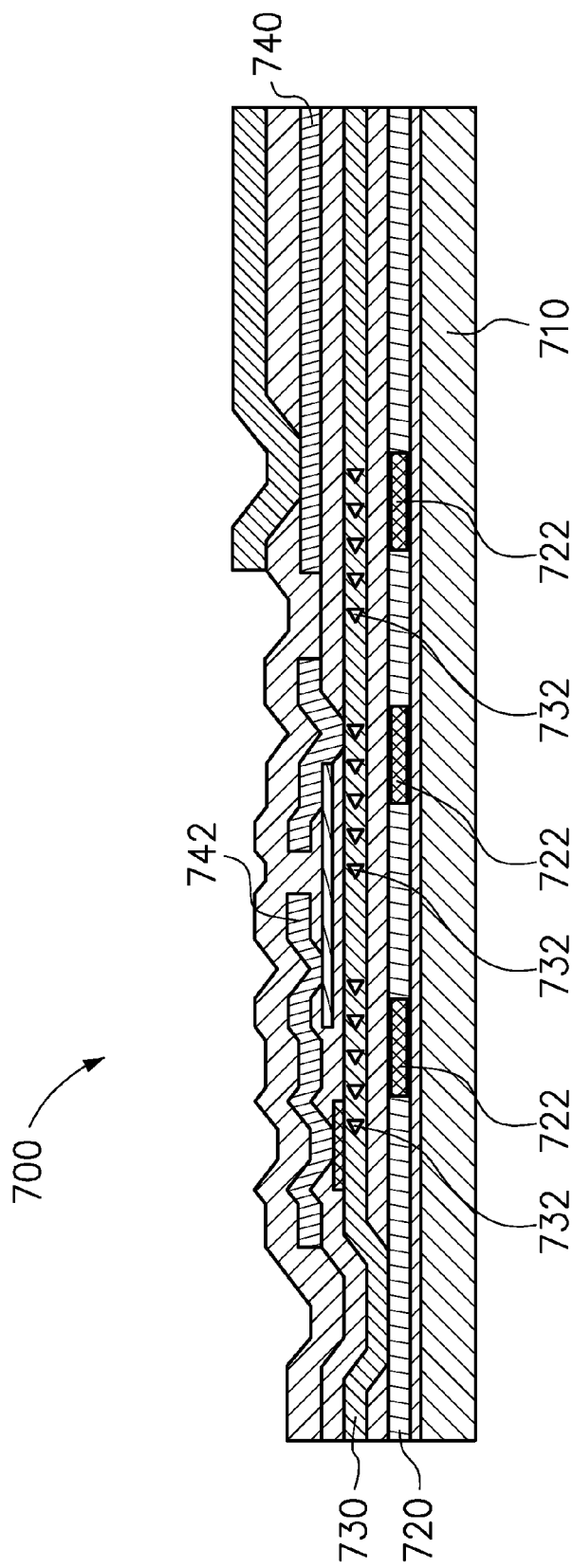
FIG. 8 shows a side cross-section view of a superconducting device having a pattern of engineered defects in one superconducting layer and potential wells located within another superconducting layer.

FIG. 8 shows a side cross-section view of a superconducting device 700 having a pattern of engineered defects in one superconducting layer and potential wells located within another superconducting layer. Device 700 includes a substrate layer 710 a first superconducting layer 720, a second superconducting layer 730, and a circuitry layer 740 containing a circuitry region 742 therein. Each of the superconducting layers and circuitry layer 740 may be separated by oxide layers. As an example, the oxide layers may comprise $SiO_2$, while superconducting layers 720 and 730 comprise niobium. As shown, first superconducting layer 720 and second superconducting layer 730 are both parallel to circuitry layer 740.

Superconducting layer 720, which is the closest to substrate 710, contains at least one potential wells 722 therein. Superconducting layer 730, which is between superconducting layer 730 and circuitry layer 740, contains at least one pattern of engineered defects 732 therein. In the embodiment shown in FIG. 8, each pattern of engineered defects 732 is substantially aligned above a potential well 722. However, this is not a requirement, and other embodiments having different configurations are well within the scope of the appended claims.

Figure 9:
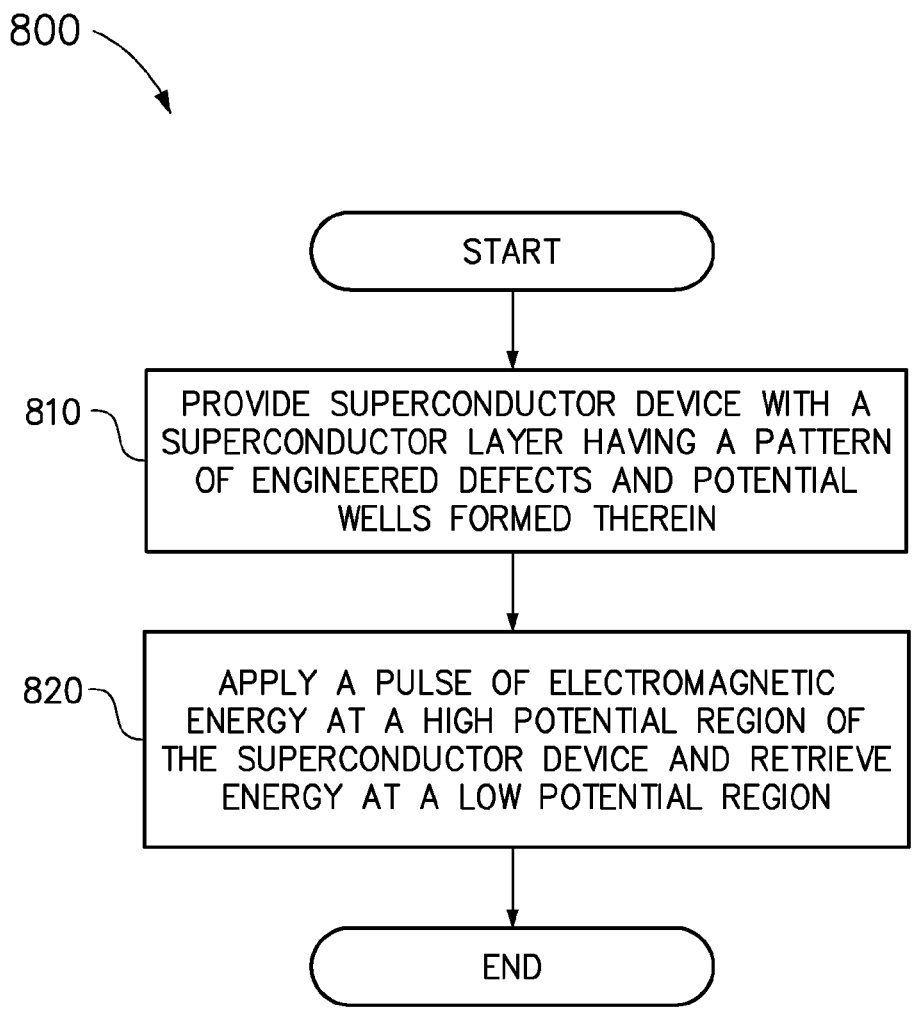
FIG. 9 shows a flowchart of an embodiment of a method for removing the flux trapped in a superconducting device from the sensitive circuitry regions of the device, in accordance with the Superconductor Device Having a Pattern of Engineered Defects for Controlling Magnetic Flux.

FIG. 9 shows a flowchart of an embodiment of a method 800 for removing the flux trapped in a superconducting device from the sensitive circuitry regions of the device, in accordance with the Superconductor Device Having a Pattern of Engineered Defects for Controlling Magnetic Flux. For illustrative purposes, method 800 will be discussed with reference to device 500 shown in FIG. 6. Method 800 may begin at step 810, which involves providing a superconductor device 500 having a superconducting layer 520 and a circuitry layer 540. Superconducting layer 520 has a plurality of naturally-occurring defects therein, one or more potential wells 524 formed therein, and a pattern of engineered defects 522 formed therein. Pattern of engineered defects is configured based upon the size of the semiconductor device, the type of superconducting material of superconducting layer 520, and the type and the size of the engineered defects.

Method 800 may then proceed to step 820, which involves applying a pulse of electromagnetic energy at a high potential region of the superconductor device and retrieving the pulse of electromagnetic energy at a low potential region of the superconductor device. Step 820 occurs prior to energizing a circuit 542 within circuitry layer 540 and when the temperature of superconducting layer 520 is within a superconducting state. As an example, this temperature may be in the vicinity of the transition temperature, where control of the trapped flux can be better achieved. Upon encountering the pulse of electromagnetic energy, pattern of engineered defects 522, based upon its configuration, directs magnetic flux trapped within the naturally-occurring defects to potential well 524 (as shown, for example, in FIG. 5).

Many modifications and variations of the Superconductor Device Having a Pattern of Engineered Defects for Controlling Magnetic Flux are possible in light of the above description. Within the scope of the appended claims, the embodiments of the Superconductor Device Having a Pattern of Engineered Defects for Controlling Magnetic Flux described herein may be practiced otherwise than as specifically described. The scope of the claims is not limited to the implementations and the embodiments disclosed herein, but extends to other implementations and embodiments as may be contemplated by those persons having ordinary skill in the art.

We claim:

1. A superconductor device comprising:
a circuitry layer having one or more circuitry regions therein; and
a superconducting layer having a plurality of naturally-occurring defects therein, more than one potential wells formed therein and located outside of the bounds of the circuitry regions, and a pattern of engineered defects formed therein, the pattern of engineered defects configured such that, upon encountering a pulse of electromagnetic energy applied at a high potential region of the superconducting layer prior to energizing any circuits within the circuitry layer and when the superconducting layer is in a superconducting state, magnetic flux trapped within the naturally-occurring defects is directed to one or more of the potential wells.

2. The superconductor device of claim 1, wherein the superconducting layer is parallel to the circuitry layer.

3. The superconductor device of claim 1, wherein the pattern of engineered defects is configured based upon the size of the superconducting layer, the type of superconducting material of the superconducting layer, and the type and size of the engineered defects.

4. The superconductor device of claim 1, wherein the number of potential wells formed within the superconducting layer is based upon the size of the pattern of engineered defects.

5. The superconductor device of claim 1, wherein the pattern of engineered defects is contained within an engineered defect region, wherein the superconducting layer has a plurality of engineered defect regions therein, wherein each engineered defect region includes one of the potential wells.

6. The superconductor device of claim 1, wherein the pattern of engineered defects contains a plurality of asymmetrically patterned engineered defects.

7. The superconductor device of claim 1, wherein the superconducting layer is located below the circuitry layer.

8. The superconductor device of claim 1, wherein the superconducting layer comprises a niobium-based material.

9. A superconductor device comprising:
a circuitry layer having one or more circuitry regions therein;
a first superconducting layer having a plurality of naturally-occurring defects and more than one potential wells formed therein, the potential wells located outside of the bounds of the circuitry regions; and
a second superconducting layer parallel to the circuitry layer, the second superconducting layer having a pattern of engineered defects therein, wherein the pattern of engineered defects is configured such that, upon encountering a pulse of electromagnetic energy that is applied at a high potential region of the second superconducting layer prior to energizing any circuits within the circuitry layer and when the second superconducting layer is in a superconducting state, magnetic flux trapped within the naturally-occurring defects and the second superconducting layer is directed to one or more of the potential wells.

10. The superconductor device of claim 9, wherein the pattern of engineered defects is configured based upon the size of the second superconducting layer, the type of superconducting material of the second superconducting layer, and the type and size of the engineered defects.

11. The superconductor device of claim 9, wherein the number of potential wells formed within the first superconducting layer is based upon the size of the pattern of engineered defects.

12. The superconductor device of claim 9, wherein the pattern of engineered defects is contained within an engineered defect region, wherein the second superconducting layer has a plurality of engineered defect regions therein, wherein each engineered defect region includes one of the potential wells.

13. The superconductor device of claim 9, wherein the pattern of engineered defects contains a plurality of asymmetrically patterned engineered defects.

14. The superconductor device of claim 9, wherein the second superconducting layer is located between the first superconducting layer and the circuitry layer.

15. The superconductor device of claim 9, wherein the second superconducting layer is located below the first superconducting layer and the circuitry layer.

16. The superconductor device of claim 9, wherein the second superconducting layer comprises a niobium-based material.

17. A method comprising the steps of:
providing a superconductor device having a superconducting layer and a circuitry layer, the superconducting layer having a plurality of naturally-occurring defects therein, more than one potential wells formed therein, and a pattern of engineered defects formed therein, wherein the pattern of engineered defects is configured based upon the size of the semiconductor chip, the type of superconducting material of the superconducting layer, and the type and the size of the engineered defects; and
applying a pulse of electromagnetic energy at a high potential region of the superconductor device and retrieving the pulse of electromagnetic energy at a low potential region of the superconductor device prior to energizing a circuit within the circuitry layer and when the temperature of the superconducting layer is within a superconducting state, wherein the pattern of engineered defects, upon encountering the pulse of electromagnetic energy, is configured to direct magnetic flux trapped within the naturally-occurring defects to one or more of the potential wells.

18. The method of claim 17, wherein the pattern of engineered defects is contained within a engineered defect region, wherein the second superconducting layer has a plurality of engineered defect regions therein, wherein each engineered defect region includes one of the potential wells, wherein the pulse of electromagnetic energy is applied at a high potential region of each engineered defect region and retrieved at a low potential region of each engineered defect region.

19. The method of claim 17, wherein the pattern of engineered defects contains a plurality of asymmetrically patterned engineered defects.

20. The method of claim 17, wherein the superconducting layer comprises a niobium-based material.

* * * * *